US011532727B2

(12) United States Patent
Colinge et al.

(10) Patent No.: US 11,532,727 B2
(45) Date of Patent: Dec. 20, 2022

(54) METHOD OF FORMING TRANSISTOR

(71) Applicant: Taiwan Semiconductor Manufacturing Company Limited, Hsinchu (TW)

(72) Inventors: Jean-Pierre Colinge, Hsinchu (TW); Carlos H. Diaz, Mountain View, CA (US)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 197 days.

(21) Appl. No.: 17/106,244

(22) Filed: Nov. 30, 2020

(65) Prior Publication Data
US 2021/0104618 A1 Apr. 8, 2021

Related U.S. Application Data

(62) Division of application No. 14/475,618, filed on Sep. 3, 2014, now Pat. No. 10,854,735.

(51) Int. Cl.
*H01L 21/02* (2006.01)
*H01L 29/66* (2006.01)
(Continued)

(52) U.S. Cl.
CPC ........ *H01L 29/66742* (2013.01); *B82Y 10/00* (2013.01); *H01L 21/823487* (2013.01);
(Continued)

(58) Field of Classification Search
CPC ......... H01L 29/42392; H01L 29/78684; H01L 29/78696; H01L 29/0847; H01L 29/78642;
(Continued)

(56) References Cited

U.S. PATENT DOCUMENTS 8,053,846 B2   11/2011   Cha et al.
8,159,037 B2   4/2012    Woo et al.
(Continued)

FOREIGN PATENT DOCUMENTS

CN   103730507   4/2014
CN   103824855   5/2014
(Continued)

OTHER PUBLICATIONS

Korean Office Action; Application No. 10-2014-0188094; dated Jan. 28, 2016.
(Continued)

*Primary Examiner* — Savitri Mulpuri
(74) *Attorney, Agent, or Firm* — Jones Day

(57) ABSTRACT

According to another embodiment, a method of forming a transistor is provided. The method includes the following operations: providing a substrate; providing a source over the substrate; providing a channel connected to the source; providing a drain connected to the channel; providing a gate insulator adjacent to the channel; providing a gate adjacent to the gate insulator; providing a first interlayer dielectric between the source and the gate; and providing a second
(Continued)

interlayer dielectric between the drain and the gate, wherein at least one of the formation of the source, the drain, and the channel includes about 20-95 atomic percent of Sn.

20 Claims, 14 Drawing Sheets

(51) Int. Cl.

| | | |
|---|---|---|
| *H01L 29/10* | (2006.01) | |
| *H01L 29/08* | (2006.01) | |
| *H01L 29/786* | (2006.01) | |
| *B82Y 10/00* | (2011.01) | |
| *H01L 29/06* | (2006.01) | |
| *H01L 29/775* | (2006.01) | |
| *H01L 29/423* | (2006.01) | |
| *H01L 21/8234* | (2006.01) | |
| *H01L 21/8238* | (2006.01) | |

(52) U.S. Cl.
CPC .... *H01L 21/823885* (2013.01); *H01L 29/068* (2013.01); *H01L 29/0676* (2013.01); *H01L 29/0847* (2013.01); *H01L 29/1033* (2013.01); *H01L 29/42392* (2013.01); *H01L 29/66439* (2013.01); *H01L 29/775* (2013.01); *H01L 29/78642* (2013.01); *H01L 29/78681* (2013.01); *H01L 29/78684* (2013.01); *H01L 29/78696* (2013.01); *H01L 21/0245* (2013.01); *H01L 21/02381* (2013.01); *H01L 21/02532* (2013.01)

(58) Field of Classification Search
CPC ......... H01L 29/78681; H01L 29/66742; H01L 29/775; H01L 29/0676; H01L 29/068; H01L 29/1033; H01L 29/66439; H01L 21/0245; H01L 21/02381; H01L 21/02532; H01L 21/823431; H01L 21/823487; H01L 21/823885; B82Y 10/00
See application file for complete search history.

(56) References Cited

U.S. PATENT DOCUMENTS

| | | |
|---|---|---|
| 8,264,032 B2 | 9/2012 | Yeh et al. |
| 8,455,316 B2 | 6/2013 | Son et al. |
| 8,536,620 B2 | 9/2013 | Riechert et al. |
| 8,643,087 B2 | 2/2014 | Sandhu et al. |
| 9,029,211 B2 | 5/2015 | Xiao |
| 9,105,475 B1 | 8/2015 | Wang et al. |
| 2004/0197975 A1 | 10/2004 | Krivokapic et al. |
| 2007/0196973 A1 | 8/2007 | Park |
| 2013/0285153 A1 | 10/2013 | Lee et al. |
| 2014/0027783 A1 | 1/2014 | Yin et al. |
| 2014/0048765 A1 | 2/2014 | Ma et al. |
| 2014/0054547 A1 | 2/2014 | Eneman et al. |
| 2014/0138744 A1 | 5/2014 | Kotlyar et al. |

FOREIGN PATENT DOCUMENTS

| | | |
|---|---|---|
| CN | 103824885 | 5/2014 |
| CN | 103839829 | 6/2014 |
| JP | 2008072104 | 3/2008 |
| KR | 20060012724 | 2/2006 |
| KR | 20110025075 | 3/2011 |
| KR | 20110071737 | 6/2011 |
| TW | 201342600 | 10/2013 |
| TW | 201344913 | 11/2013 |

OTHER PUBLICATIONS

Korean Office Action; Application No. 10-2014-0188094; dated Jul. 22, 2016.
Taiwan Office Action; Application No. 104129122; dated Nov. 3, 2016.
Taiwan Office Action; Application No. 104129122; dated Jun. 7, 2017.
Chinese Office Action; Application No. 201510252854.3; dated Sep. 3, 2018.
Uniaxially Strained Germanium-Tin (GeSn) Gate-All-Around Nanowire PFETs Enabled by a Novel Top-Down Nanowire Formation Technology; Gong et al.; 2013.

METHOD OF FORMING TRANSISTOR

CROSS-REFERENCE TO RELATED APPLICATIONS

This application is a divisional application of U.S. patent application Ser. No. 14/475,618 filed Sep. 3, 2014, which is incorporated herein by reference in its entirety.

BACKGROUND

Semiconductor devices, such as gate-all-around (GAA) transistors, are an emerging research area in the semiconductor industry. However, speed of the device is a challenge because of material limitations. Therefore, there is a need to improve the above deficiency.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
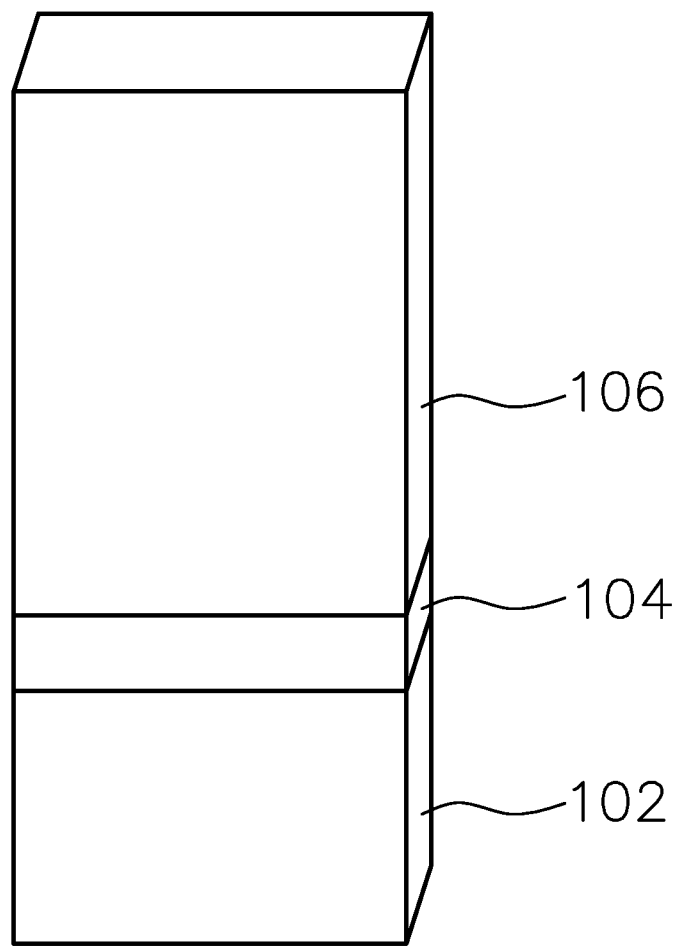
FIG. 1 is a three dimensional view of an exemplary vertical gate all around structure at a first stage during fabrication in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

This disclosure provides an alloy for a transistor, the alloy (e.g., SiSn, GeSn, and SiGeSn) has about 20-90 atomic percent of Sn to form a source/drain and a channel so that the transistor can withstand high-temperature processing. Careful selection of the atomic percent of Sn makes possible a transistor with a metallic source, drain, and semiconducting channel made of the same material. For example, GeSn with 70 atomic percent of Sn and 30 atomic percent of Ge provides a melting point at 650° C. and can be used to make a transistor.

The transistor includes the alloy with varying cross section. In a central region, the cross section is small enough for the alloy to become semiconducting and defines the channel region. The cross section is increased in conjunction with the channel to form the metallic source/drain. The source/drain regions have a larger cross section than does the channel region. The channel region is surrounded by a gate stack, as in a gate all-around MOSFET, either vertical or horizontal in direction. The channel sandwiched between the source and the drain exhibits a band gap determined by the nanowire cross section. For example, by using GeSn with 70 atomic percent of Sn and 30 atomic percent of Ge, a channel with a cross section of 4-5 nanometers provides a positive band gap, and a source/drain region with a larger cross section of for example 10 nanometers provides a zero or negative band gap. In the embodiment, it is not necessary to form junctions since the source/drain regions are made of the same metallic alloy, but it is possible to make junctions if desired.

FIG. 1 is a three dimensional view of an exemplary vertical gate all around structure at a first stage during fabrication in accordance with some embodiments. As shown in FIG. 1, a bulk material 106 (e.g., SiSn, GeSn, or SiGeSn) is provided over the substrate 102. In the embodiment, an additional buffer 104 (e.g., SiGe, Ge) for epitaxial growth is provided between the substrate 102 and the bulk material 106. In some embodiments, the additional buffer 104 is negligible. The substrate 102 includes any number of materials, such as, for example, silicon, polysilicon, germanium, etc., alone or in combination. In some embodiments, the substrate 102 includes an epitaxial layer, a silicon-on-insulator (SOI) structure, a wafer, or a die formed from a wafer.

In some embodiments, the material of the bulk material 106 is made of SiSn and contains about 20-95 atomic percent of Sn. For example, a SiSn alloy with about 70 atomic percent of Sn and about 30 atomic percent of Si provides a melting point at 1300° C. and can be used as the material to make a transistor which withstands high-temperature processing (e.g., 900-1000° C.). In some embodiments, the atomic percent of Sn of the bulk material 106 made of SiSn is from about at least one of: 20% to 30%, 30% to 40%, 40% to 50%, 50% to 60%, 60% to 70%, 70% to 80%, 80% to 90%, 90% to 95%, 25% to 35%, 35% to 45%, 45% to 55%, 55% to 65%, 65% to 75%, 75% to 85%, and 85% to 95%.

In some embodiments, the material of the bulk material 106 is made of GeSn and contains about 20-90 atomic percent of Sn. For example, a GeSn alloy with about 70 atomic percent of Sn and about 30 atomic percent of Ge provides a melting point at 650° C. and can be used as the material to make a transistor which withstands high-temperature processing (e.g., 450-500° C.). In some embodiments, the atomic percent of Sn of the bulk material 106 made of GeSn is from about at least one of: 20% to 30%, 30% to 40%, 40% to 50%, 50% to 60%, 60% to 70%, 70% to 80%, 80% to 90%, 25% to 35%, 35% to 45%, 45% to 55%, 55% to 65%, 65% to 75%, and 75% to 85%.

Figure 2:
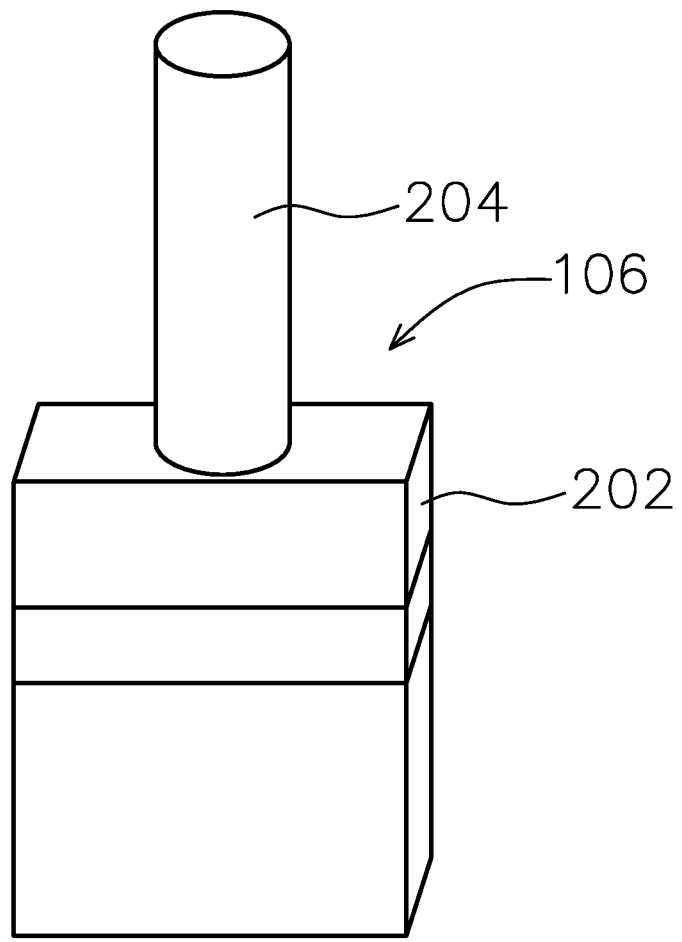
FIG. 2 is a three dimensional view of the exemplary vertical gate all around structure at a second stage during fabrication in accordance with some embodiments.

FIG. 2 is a three dimensional view of the exemplary vertical gate all around structure at a second stage during fabrication in accordance with some embodiments. As shown in FIG. 2, the bulk material 106 is etched to form a source 202 and a nanowire 204. The nanowire 204 is formed in any number of ways known to those skilled in the art, such as by patterning and etching.

Figure 3:
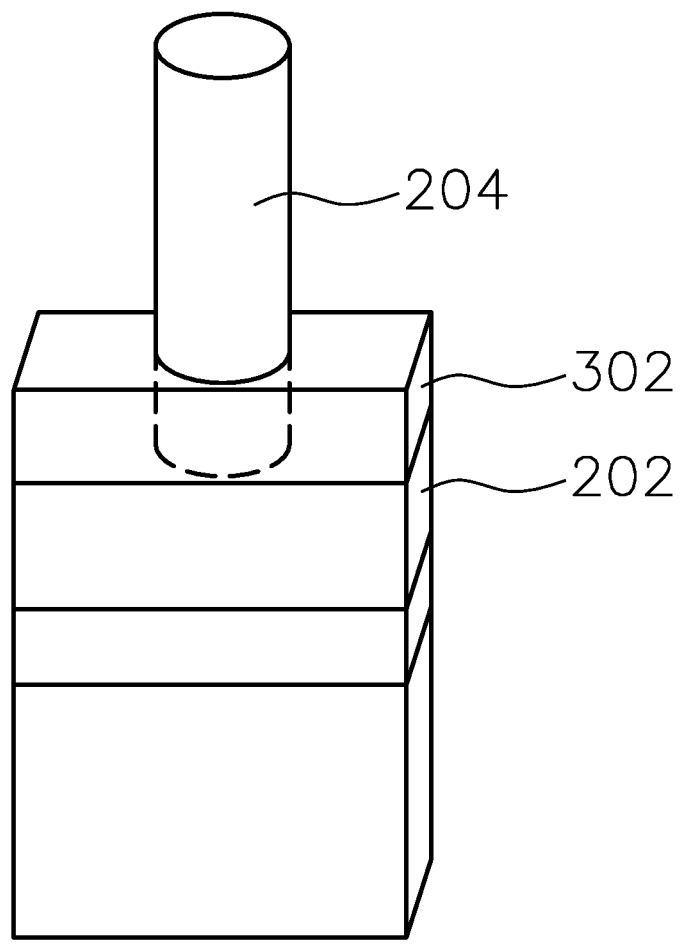
FIG. 3 is a three dimensional view of the exemplary vertical gate all around structure at a third stage during fabrication in accordance with some embodiments.

FIG. 3 is a three dimensional view of the exemplary vertical gate all around structure at a third stage during fabrication in accordance with some embodiments. As shown in FIG. 3, a first interlayer dielectric 302 is formed over the source 202. The formation of the first interlayer dielectric 302 may include: depositing the first interlayer dielectric 302; performing CMP on the first interlayer dielectric 302, stopping at the nanowire 204; and etching back the first interlayer dielectric 302 to expose a portion of the nanowire 204. The deposition of the first interlayer dielectric 302 may be realized in any number of ways, such as by thermal growth, chemical growth, atomic layer deposition (ALD), chemical vapor deposition (CVD), spin-on deposition or plasma-enhanced chemical vapor deposition (PECVD).

Figure 4:
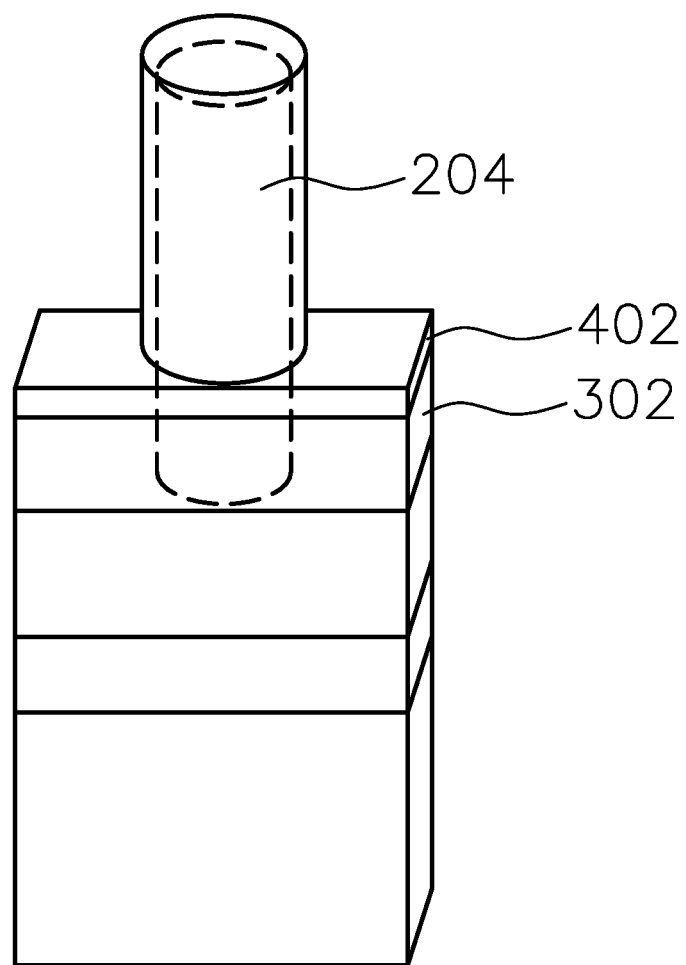
FIG. 4 is a three dimensional view of the exemplary vertical gate all around structure at a fourth stage during fabrication in accordance with some embodiments.

FIG. 4 is a three dimensional view of the exemplary vertical gate all around structure a fourth stage during fabrication in accordance with some embodiments. As shown in FIG. 4, a gate insulator 402 is formed adjacent to the nanowire 204 and over the first interlayer dielectric 302. The gate insulator 402 may be a single layer or multiple layers structure with HfO2, ZrO2, HfZrO2, Ga2O3, Gd2O3, TaSiO2, Al2O3, SiO2, LaLuO2, TmO2, TiO2 or any other high-k dielectric.

Figure 5:
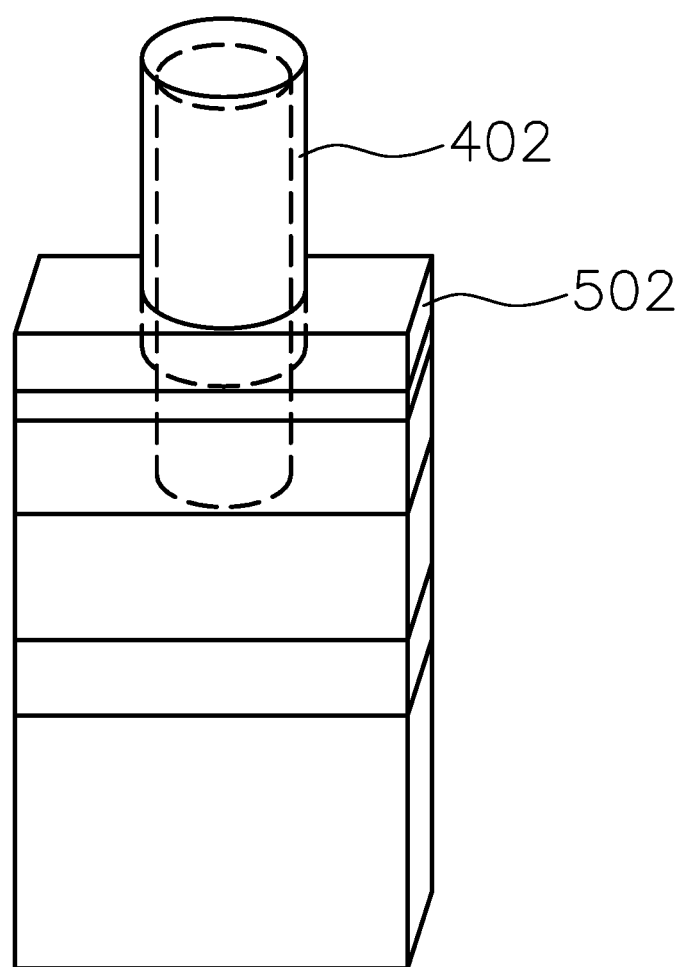
FIG. 5 is a three dimensional view of the exemplary vertical gate all around structure at a fifth stage during fabrication in accordance with some embodiments.

FIG. 5 is a three dimensional view of the exemplary vertical gate all around structure at a fifth stage during fabrication in accordance with some embodiments. As shown in FIG. 5, a gate 502 is formed adjacent to the gate insulator 402. The formation of the gate 502 may include: depositing the gate 502; performing CMP on the gate 502, stopping at the gate insulator 402; and etching back the gate 502 to expose a portion of the gate insulator 402 to be removed. The gate 502 may include work function metal ("WFM") and metal gate ("MG") material. The work function metal may be, for example, TiN, W, WN, Mo, MoN, TiAl, TiAlC, or TaAlC; the metal gate material may be Al, W, Co, Cu, or doped polysilicon.

Figure 6:
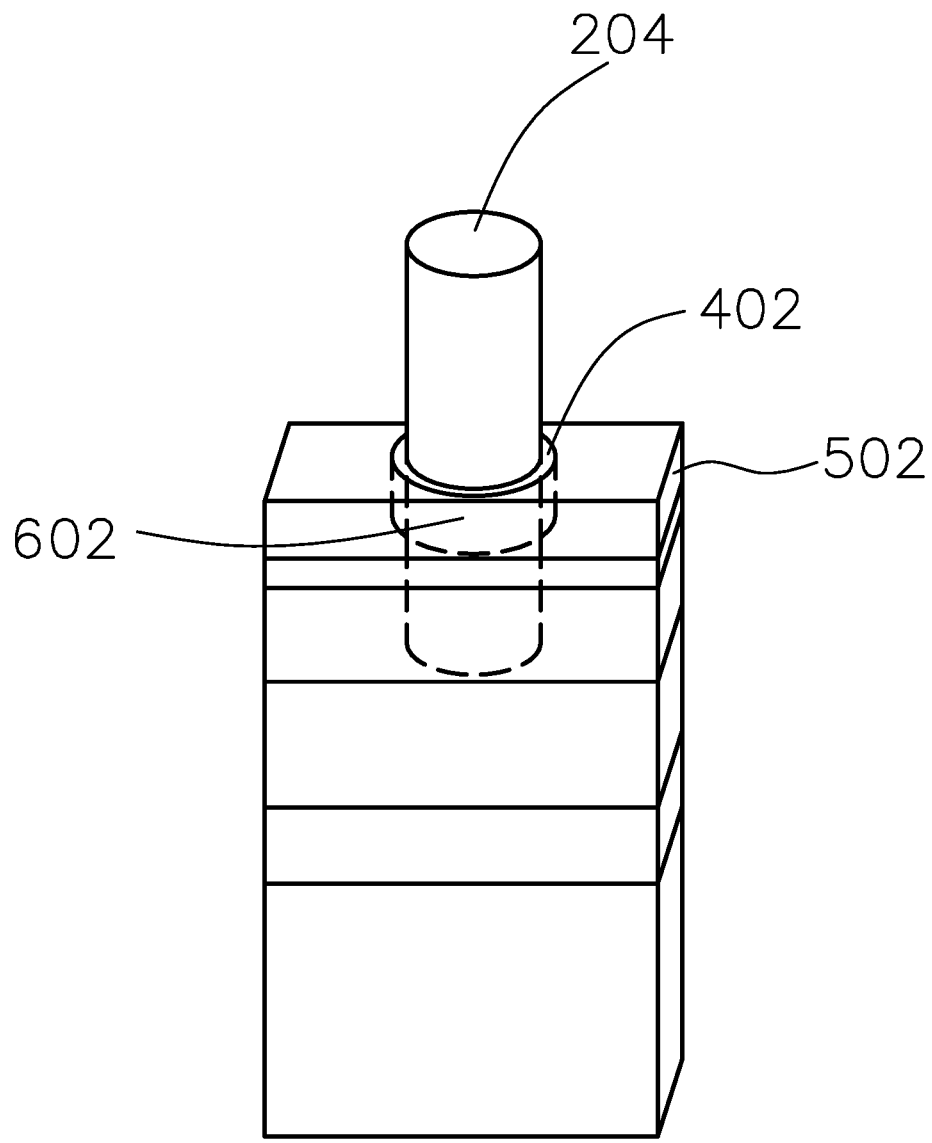
FIG. 6 is a three dimensional view of the exemplary vertical gate all around structure at a sixth stage during fabrication in accordance with some embodiments.

FIG. 6 is a three dimensional view of the exemplary vertical gate all around structure at a sixth stage during fabrication in accordance with some embodiments. As shown in FIG. 6, the gate insulator 402 is etched to expose a portion of the nanowire 204 except for that surrounded by the gate 502. The portion of the nanowire 204 surrounded by the gate 502 refers to a channel 602. The channel 602 may have a cross section of 4-5 nanometers and provide a positive band gap.

Figure 7:
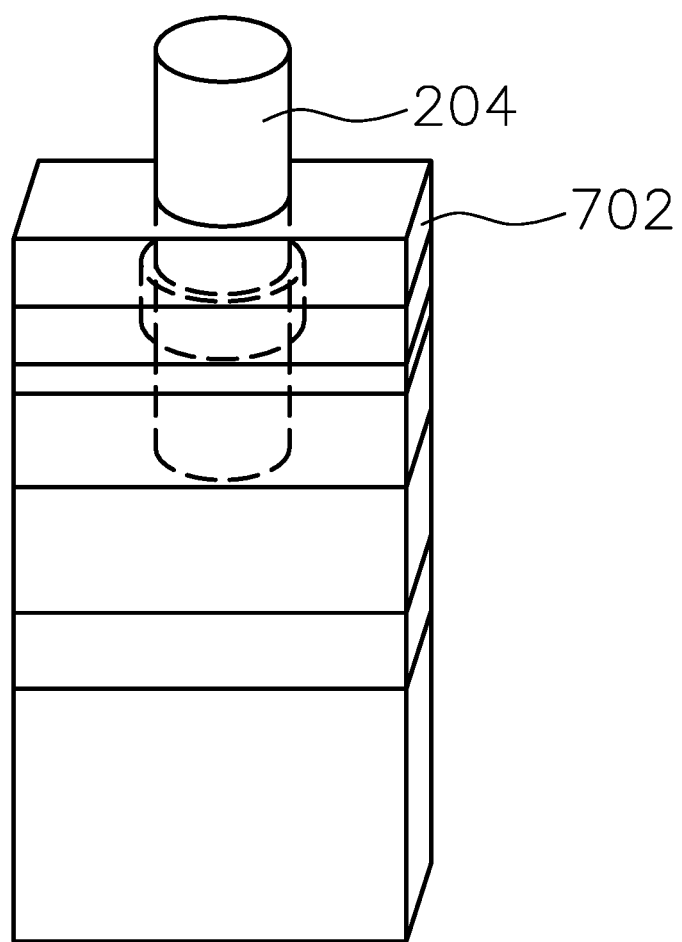
FIG. 7 is a three dimensional view of the exemplary vertical gate all around structure at a seventh stage during fabrication in accordance with some embodiments.

FIG. 7 is a three dimensional view of the exemplary vertical gate all around structure at a seventh stage during fabrication in accordance with some embodiments. As shown in FIG. 7, a second interlayer dielectric 702 is formed over the gate 502. The formation of the second interlayer dielectric 702 may include: depositing the second interlayer dielectric 702; performing CMP on the second interlayer dielectric 702, stopping at the nanowire 204; and etching back the second interlayer dielectric 702 to expose a portion of the nanowire 204. The deposition of the second interlayer dielectric 702 may be realized in any number of ways, such as by thermal growth, chemical growth, atomic layer deposition (ALD), chemical vapor deposition (CVD), plasma-enhanced chemical vapor deposition (PECVD), or spin-on deposition.

Figure 8:
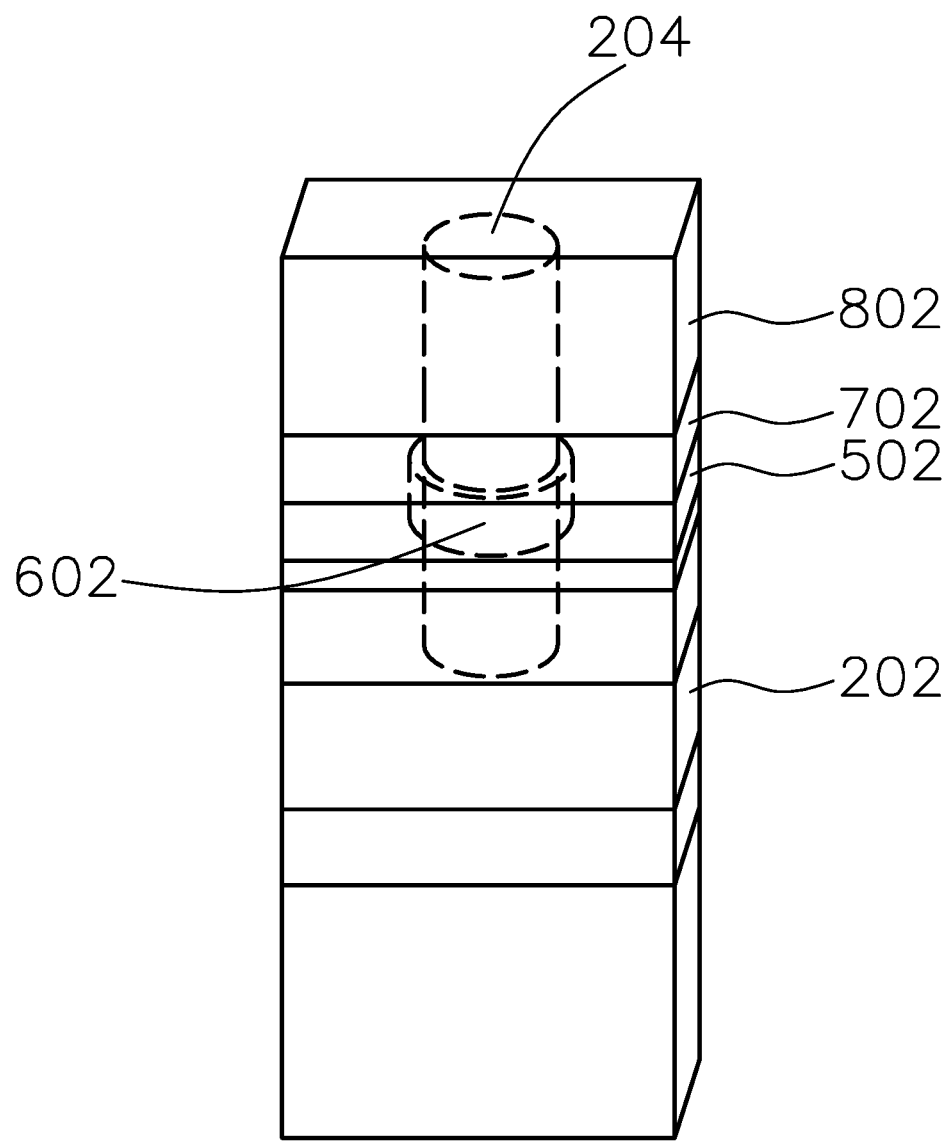
FIG. 8 is a three dimensional view of the exemplary vertical gate all around structure at an eighth stage during fabrication in accordance with some embodiments.

FIG. 8 is a three dimensional view of an exemplary vertical gate all around structure at an eighth stage during fabrication in accordance with some embodiments. As shown in FIG. 8, a drain 802 (e.g., SiSn, GeSn, or SiGeSn) is provided over the second interlayer dielectric 702 and the nanowire 204. In some embodiments, the material of the drain 802 is made of SiSn and contains about 20-95 atomic percent of Sn. For example, a Si Sn with about 70 atomic percent of Sn and about 30 atomic percent of Si provides a melting point at 1300° C. and can be used as the material to make a transistor which withstands high-temperature processing (e.g., 900-1000° C.). In some embodiments, the atomic percent of Sn of the drain 802 made of SiSn is from about at least one of: 20% to 30%, 30% to 40%, 40% to 50%, 50% to 60%, 60% to 70%, 70% to 80%, 80% to 90%, 90% to 95%, 25% to 35%, 35% to 45%, 45% to 55%, 55% to 65%, 65% to 75%, 75% to 85%, and 85% to 95%.

In some embodiments, the material of the drain 802 is made of GeSn and contains about 20-90 atomic percent of Sn. For example, a GeSn with about 70 atomic percent of Sn and about 30 atomic percent of Ge provides a melting point at 650° C. and can be used as the material to make a transistor which withstands high-temperature processing (e.g., 450-500° C.). In some embodiments, the atomic percent of Sn of the drain 802 made of GeSn is from about at least one of: 20% to 30%, 30% to 40%, 40% to 50%, 50% to 60%, 60% to 70%, 70% to 80%, 80% to 90%, 25% to 35%, 35% to 45%, 45% to 55%, 55% to 65%, 65% to 75%, and 75% to 85%.

Continuing with FIG. 8, a transistor 800 with band gap modulation is provided. The transistor 800 includes a source 202, a drain 802, a channel 602, and a gate 502. The channel 602 is sandwiched between the source 202 and the drain 802. The gate 502 controls the transistor 800 to turn on or turn off. At least one of the source 202, the drain 802, and the channel 602 contains about 20-95 atomic percent of Sn.

In some embodiments, at least one of the material of the source 202, the drain 802, and the channel 602 is made of SiSn and contains about 20-95 atomic percent of Sn. In some embodiments, the atomic percent of Sn of the drain 802 made of SiSn is from about at least one of: 20% to 30%, 30% to 40%, 40% to 50%, 50% to 60%, 60% to 70%, 70% to 80%, 80% to 90%, 90% to 95%, 25% to 35%, 35% to 45%, 45% to 55%, 55% to 65%, 65% to 75%, 75% to 85%, and 85% to 95%.

In some embodiments, at least one of the material of the source 202, the drain 802, and the channel 602 is made of SiGeSn and contains about 20-95 atomic percent of Sn. In some embodiments, the atomic percent of Sn of the drain 802 made of SiGeSn is from about at least one of: 20% to 30%, 30% to 40%, 40% to 50%, 50% to 60%, 60% to 70%, 70% to 80%, 80% to 90%, 90% to 95%, 25% to 35%, 35% to 45%, 45% to 55%, 55% to 65%, 65% to 75%, 75% to 85%, and 85% to 95%.

In some embodiments, at least one of the material of the source 202, the drain 802, and the channel 602 is made of GeSn and contains about 20-90 atomic percent of Sn. In some embodiments, the atomic percent of Sn of the drain 802 made of GeSn is from about at least one of: 20% to 30%, 30% to 40%, 40% to 50%, 50% to 60%, 60% to 70%, 70% to 80%, 80% to 90%, 25% to 35%, 35% to 45%, 45% to 55%, 55% to 65%, 65% to 75%, and 75% to 85%.

The transistor 800 includes an alloy with varying cross section. In a central region, the cross section is small enough for the alloy to become semiconducting and defines the channel region 602. The cross section is increased in conjunction with the channel 602 to form the metallic source/drain 202, 802. The metallic source/drain regions 202, 802 have a larger cross section than does the channel region 602. The channel region 602 is surrounded by a gate 502, as in a gate all-around MOSFET, either vertical or horizontal in direction. The channel 602 sandwiched between the source 202 and the drain 802 exhibits a band gap determined by the nanowire cross section. For example, by using GeSn with 70 atomic percent of Sn and 30 atomic percent of Ge, a channel with a cross section of 4-5 nanometers provides a positive band gap, and a source/drain region with a larger cross section of, for example, 10 nanometers provides a zero or negative band gap.

Figure 9:
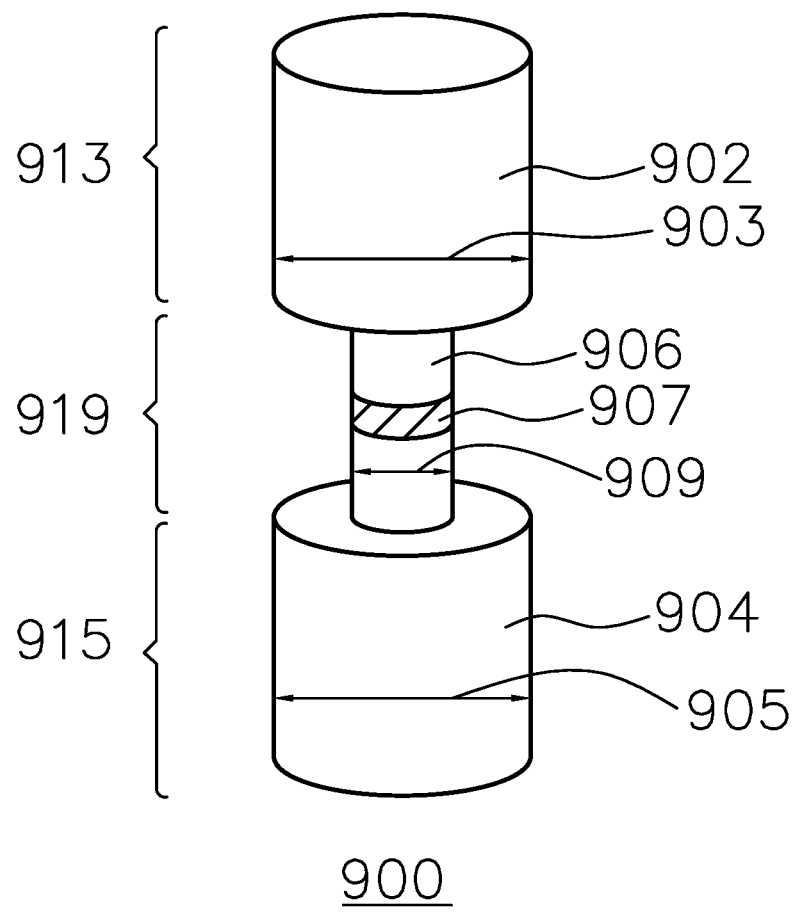
FIG. 9 is a three dimensional view of an exemplary vertical gate all around structure in accordance with some embodiments.

FIG. 9 is a three dimensional view of an exemplary vertical gate all around structure in accordance with some embodiments. As shown in FIG. 9, a semiconductor structure 900 with band gap modulation is provided. The semiconductor structure 900 includes a source 904, a drain 902, and a channel 907 in a nanowire 906. The channel 907 is sandwiched between the source 904 and the drain 902. The gate (not shown) controls the transistor 900 to turn it on or turn it off. At least one of the source 904, the drain 902, and the channel 907 contains about 20-95 atomic percent of Sn. Typical dimensions of the semiconductor structure 900 are demonstrated as follows. The source/drain 902, 904 with diameters 903, 905 of 5-30 nanometers may provide a zero or negative band gap, and the channel 907 with a diameter of 1-15 nanometers may provide a positive band gap. The source/drain 902, 904 and the channel 907 may have a thickness of 5-30 nanometers. In the embodiment, it is not necessary to form PN or Schottky junctions since the source/drain 902, 904 are made of the metallic alloy, but it is possible to make PN or Schottky junctions if desired.

Figure 10:
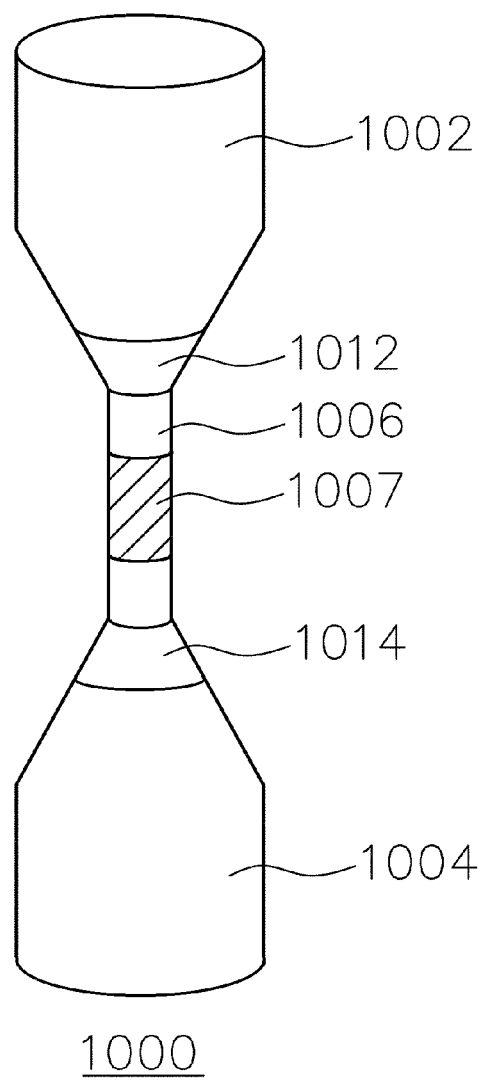
FIG. 10 is a three dimensional view of an exemplary vertical gate all around structure in accordance with some embodiments.

FIG. 10 is a three dimensional view of an exemplary vertical gate all around structure in accordance with some embodiments. As shown in FIG. 10, a semiconductor structure 1000 with band gap modulation is provided. The semiconductor structure 1000 includes a source 1004, a drain 1002, regions of varying diameter 1012, 1014, and a channel 1007 in a nanowire 1006. The channel 1007 is sandwiched between the source 1004 and the drain 1002. The gate (not shown) controls the transistor 1000 to turn on or turn off. Compared to FIG. 9, the semiconductor structure 1000 includes additional regions of varying diameter 1012, 1014. Each of the junctions 1012, 1014 connects the source/drain 1002, 1004 respectively. The dimensions of the semiconductor structure 1000 may be similar to that in FIG. 9 and are not repeated herein.

Figure 11A:
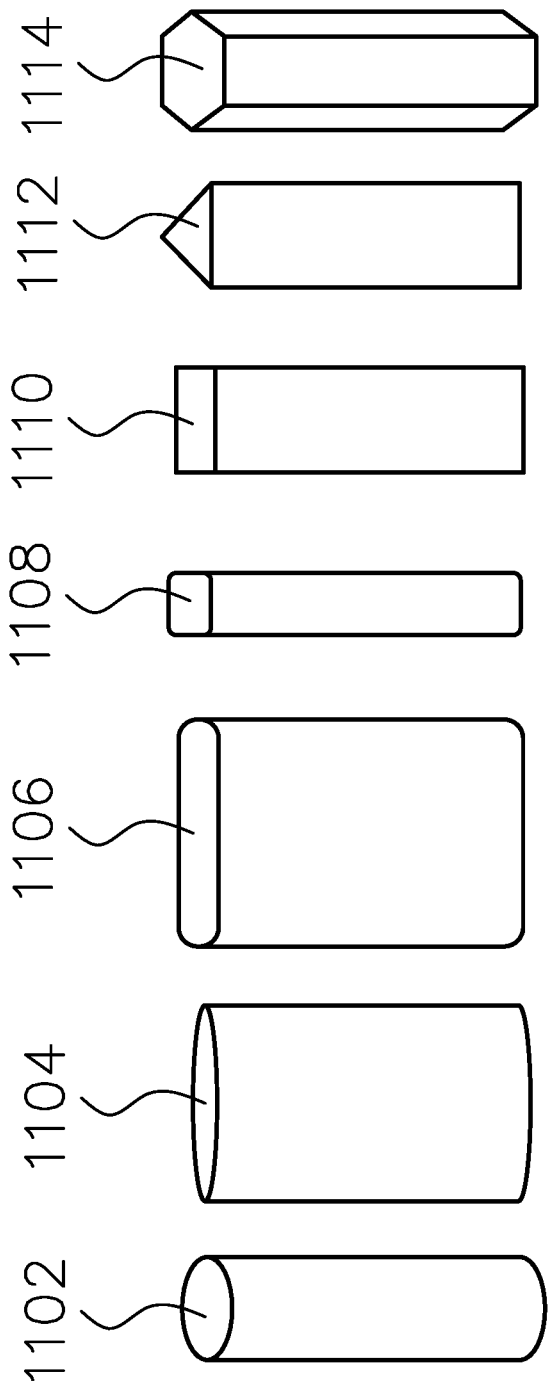
FIG. 11A is a three dimensional view of exemplary vertical nanowire structures in accordance with some embodiments.

FIG. 11A is a three dimensional view of exemplary vertical nanowire structures in accordance with some embodiments. As shown in FIG. 11A, various vertical nanowires perpendicular to a substrate (not shown) may be applied to a transistor with band gap modulation according to an embodiment, such as a circular nanowire 1102, an elliptical nanowire 1104, a bar nanowire 1106, a rounded square nanowire 1108, a square nanowire 1110, a triangular nanowire 1112, or a hexagonal nanowire 1114. Types of nanowires are not limited to the above-mentioned and can be any possibilities.

Figure 11B:
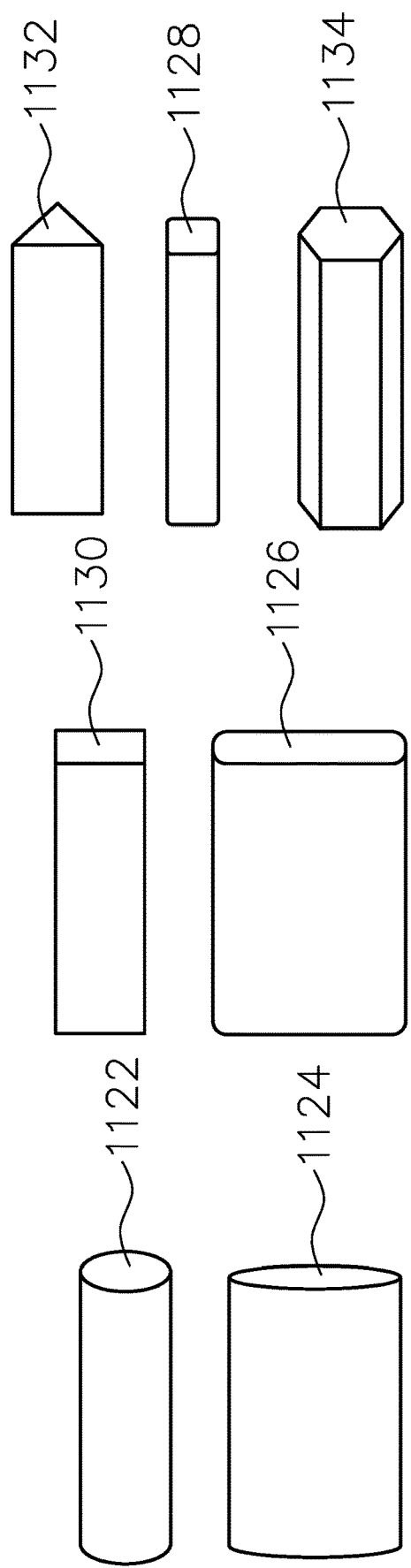
FIG. 11B is a three dimensional view of exemplary horizontal nanowire structures instead of vertical ones in accordance with some embodiments.

FIG. 11B is a three dimensional view of exemplary horizontal nanowire structures instead of vertical ones in accordance with some embodiments. As shown in FIG. 11B, various horizontal nanowires in parallel with a substrate (not shown) may be applied to a transistor with band gap modulation according to an embodiment, such as a circular nanowire 1122, an elliptical nanowire 1124, a bar nanowire 1126, a rounded square nanowire 1128, a square nanowire 1130, a triangular nanowire 1132, or a hexagonal nanowire 1134.

Figure 12:
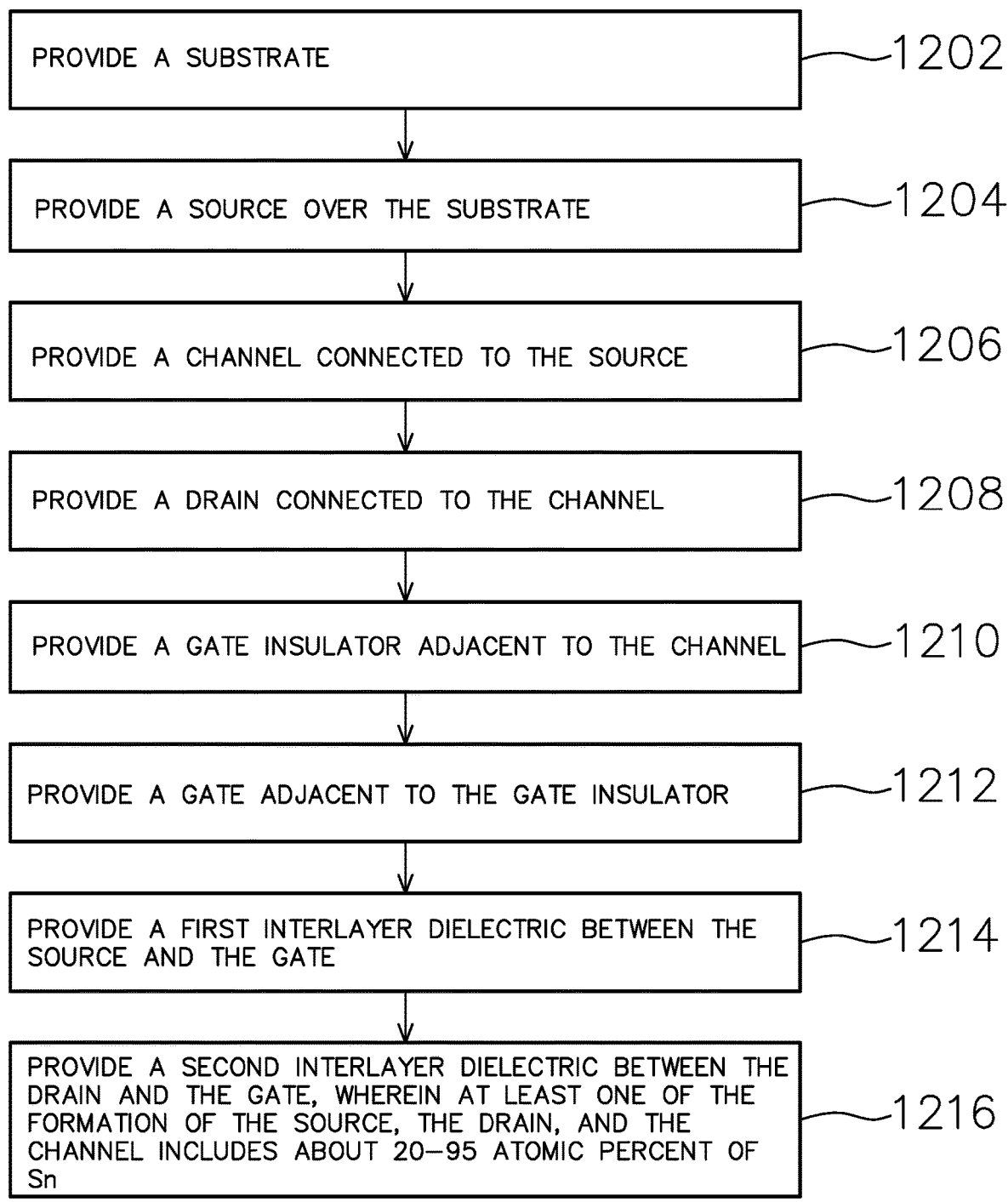
FIG. 12 is a flow chart of a method of forming a transistor.

FIG. 12 is a flow chart of a method of forming a transistor. The method 1200 includes the following operations: providing a substrate (1202); providing a source over the substrate (1204); providing a channel connected to the source (1206); providing a drain connected to the channel (1208); providing a gate insulator adjacent to the channel (1210); providing a gate adjacent to the gate insulator (1212); providing a first interlayer dielectric between the source and the gate (1214); and providing a second interlayer dielectric between the drain and the gate, wherein at least one of the formation of the source, the drain, and the channel includes about 20-95 atomic percent of Sn (1216).

The method 1200 further includes formation of the source, the drain, and the channel using the same material with about 70 atomic percent of Sn, and wherein the formation of the source and the drain further comprises forming a larger cross section in the source and the drain than in the channel.

Figure 13:
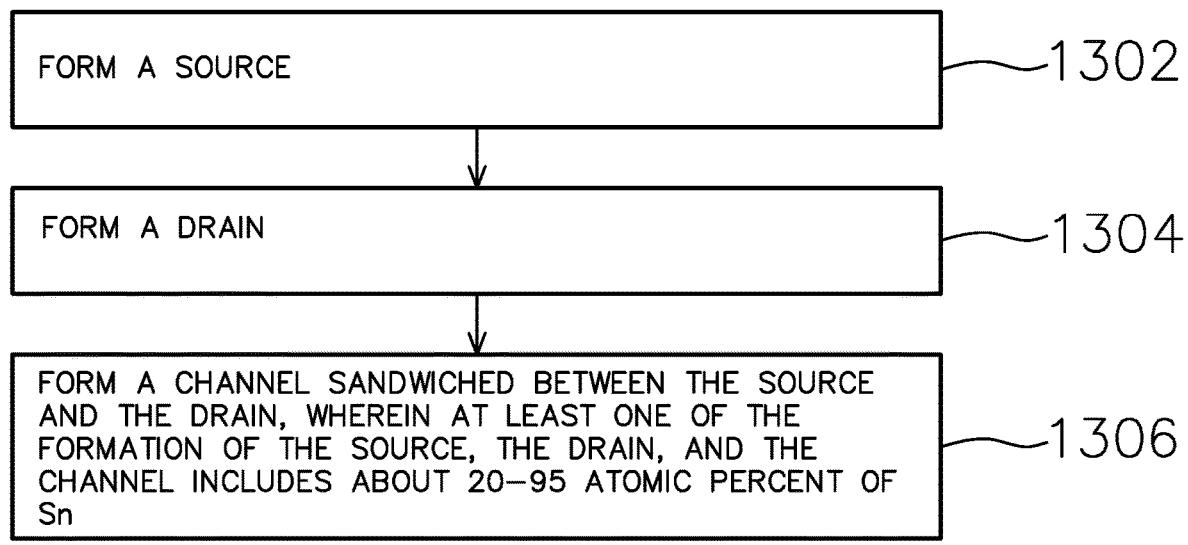
FIG. 13 is a flow chart of a method of forming a transistor.

FIG. 13 is a flow chart of a method of forming a transistor. The method 1300 includes the following operations: forming a source (1302); forming a drain (1304); and forming a channel sandwiched between the source and the drain, wherein at least one of the formation of the source, the drain, and the channel includes about 20-95 atomic percent of Sn (1306).

The formation of the source, the drain, and the channel includes forming with GeSn and contains about 20-90 atomic percent of Sn. The formation of the source, the drain, and the channel includes forming with SiSn. The formation of the source, the drain, and the channel includes forming with SiGeSn. The formation of the source, the drain, and the channel includes forming with the same material with about 70 atomic percent of Sn, and wherein the formation of the source and the drain further includes forming a larger cross section in the source and the drain than in the channel. The formation of the source and the drain includes forming the source and the drain with a diameter of about 5-30 nanometers, and the formation of the channel further includes forming a diameter of the channel of about 1-15 nanometers. The formation of the source, the drain, and the channel includes forming the source, the drain, and the channel to a thickness of about 5-30 nanometers. The method 130 further includes: forming a gate insulator adjacent to the channel, and forming a gate adjacent to the gate insulator.

The transistor includes the alloy with varying cross section. In the central region, the cross section is small enough for the alloy to become semiconducting and defines the channel region. The cross section is increased in conjunction with the channel to form the metallic source/drain. The source/drain regions have a larger cross section than does the channel. The channel region is surrounded by a gate stack, as in a gate all-around MOSFET, either vertical or horizontal. On the other hand, the channel sandwiched between the source and the drain exhibits a band gap determined by the nanowire cross section.

According to an embodiment, a transistor is provided. The transistor includes: a source; a drain; and a channel sandwiched between the source and the drain, wherein at least one of the source, the drain, and the channel contains about 20-95 atomic percent of Sn.

According to another embodiment, a method of forming a transistor is provided. The method includes the following operations: providing a substrate; providing a source over the substrate; providing a channel connected to the source; providing a drain connected to the channel; providing a gate insulator adjacent to the channel; providing a gate adjacent to the gate insulator; providing a first interlayer dielectric between the source and the gate; and providing a second interlayer dielectric between the drain and the gate, wherein at least one of the formation of the source, the drain, and the channel includes about 20-95 atomic percent of Sn.

According to another embodiment, a method of forming a transistor is provided. The method includes the following operations: forming a source; forming a drain; and forming a channel sandwiched between the source and the drain, wherein at least one of the formation of the source, the drain, and the channel includes about 20-95 atomic percent of Sn.

The drain may refer to a region that has been treated as a drain, or a region that has not been treated but to be treated as a drain. The source may refer to a region that has been treated as a source, or a region that has not been treated but to be treated as a source. The channel may refer to a region that has been treated as a channel, or a region that has not been treated but to be treated as a channel.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a vertical transistor structure, comprising:
    forming a substrate;
    forming a source made;
    forming a drain made;
    forming a channel interposed between the source and the drain, wherein the source, the drain, and the channel are stacked in a vertical direction relative to the substrate, the vertical direction being perpendicular to a cross-sectional area of the channel, the cross-sectional area of the channel being smaller than that of the source and the drain, wherein the source, the drain, and the channel form a vertical dumbbell shape, such that each of the source and the drain form an end of the vertical dumbbell shape, and the channel forms a middle portion of the vertical dumbbell shape and does not touch the substrate;
    forming a first junction positioned between the source and the channel, wherein the cross-sectional diameter of the first junction continuously varies in an increasing manner from the cross-sectional diameter of the channel to the cross-sectional diameter of the source to connect the source to the channel without a stepwise transition between the cross-sectional diameter of the channel and the cross-sectional diameter of the source; and
    forming a second junction positioned between the drain and the channel, wherein the cross-sectional diameter of the second junction continuously varies in an increasing manner from the cross-sectional diameter of the channel to the cross-sectional diameter of the drain to connect the drain to the channel without a stepwise transition between the cross-sectional diameter of the channel and the cross-sectional diameter of the drain;
    wherein the cross-sectional diameter of the first junction closest to the channel is equal to the cross-sectional diameter of the channel closest to the first junction; and wherein the cross-sectional diameter of the second junction closest to the channel is equal to the cross-sectional diameter of the channel closest to the second junction; and
    wherein at least a portion of the source and at least a portion of the drain have a cross-sectional diameter that varies in a vertical direction such that a portion of the source and drain closest to the substrate is different than a portion of the source and drain furthest from the substrate.

2. The method of claim 1, wherein an atomic percent of Sn is about 70 atomic percent.

3. The method of claim 1, wherein the source and the drain are metallic, and the channel is semiconducting.

4. The method of claim 2, wherein the source and the drain have a diameter of about 5-30 nanometers, and the channel has a diameter of about 1-15 nanometers.

5. The method of claim 2, wherein the source, the drain, and the channel have a thickness of about 5-30 nanometers.

6. The method of claim 1, further comprising: forming a gate insulator adjacent to the channel; and forming a gate adjacent to the gate insulator.

7. The vertical transistor structure of claim 6, wherein the channel is surrounded by a gate stack, wherein the gate stack comprises the gate insulator and the gate.

8. The vertical transistor structure of claim 1, further comprising:
    a nanowire that extends in the vertical direction, the nanowire comprising a first portion adjacent to the source and a second portion adjacent to the drain, wherein the nanowire is distinct from the source and the drain.

9. The method of claim 8, wherein a third portion of the nanowire is embedded in the drain.

10. The method of claim 8, wherein a shape of the nanowire is one of a circle, an ellipse, a triangle, and a hexagon.

11. The method of claim 8, further comprising forming regions of varying diameter between the nanowire and each of the source and the drain.

12. The method of claim 8, wherein an interlayer dielectric layer is sandwiched between the nanowire and each of the source and the drain.

13. The method of claim 8, wherein the cross-sectional area of the channel is wholly beneath that of the source or the drain.

14. A method of forming a vertical transistor structure, comprising:
    forming a substrate;
    forming a source made of GeSn, SiSn, or SiGeSn;
    forming a drain made of GeSn, SiSn, or SiGeSn;
    forming a channel made of GeSn, SiSn, or SiGeSn interposed between the source and the drain, wherein the source, the drain, and the channel are stacked in a vertical direction relative to the substrate, the vertical direction being perpendicular to a cross-sectional area of the channel, the cross-sectional area of the channel being smaller than that of the source and the drain, wherein the source, the drain, and the channel form a dumbbell shape, such that each of the source and the drain form an end of the dumbbell shape, and the channel forms a middle portion of the dumbbell shape and does not touch the substrate;
    forming a first junction positioned between the source and the channel, and
    forming a second junction positioned between the drain and the channel; and
    wherein the cross-sectional diameter of the first junction continuously varies in an increasing manner from the cross-sectional diameter of the channel to the cross-sectional diameter of the source to connect the source to the channel without a stepwise transition between the cross-sectional diameter of the channel and the cross-sectional diameter of the source; and
    wherein the cross-sectional diameter of the second junction continuously varies in an increasing manner from the cross-sectional diameter of the channel to the cross-sectional diameter of the drain to connect the drain to the channel without a stepwise transition between the cross-sectional diameter of the channel and the cross-sectional diameter of the drain;
    wherein the cross-sectional diameter of the first junction closest to the channel is equal to the cross-sectional diameter of the channel closest to the first junction; and
    wherein the cross-sectional diameter of the second junction closest to the channel is equal to the cross-sectional diameter of the channel closest to the second junction;
    wherein at least a portion of the source and at least a portion of the drain have a cross-sectional diameter that varies in a vertical direction such that a portion of the source and drain closest to the substrate is different than a portion of the source and drain furthest from the substrate.

15. The method of claim 14, wherein the source and drain have a diameter of about 5-30 nanometers.

16. The method of claim 14, wherein the source, the drain, and the channel have a thickness of about 5-30 nanometers.

17. The method of claim 14, wherein the channel has a diameter of about 1-15 nanometers.

18. The method of claim 14, further comprising: forming a gate insulator adjacent to the channel; and forming a gate adjacent to the gate insulator.

19. A method of forming a vertical transistor structure, comprising:
    forming a substrate;
    forming a source;
    forming a drain;
    forming a channel interposed between the source and the drain, wherein the source, the drain, and the channel are stacked in a vertical direction relative to the substrate, the vertical direction being perpendicular to a cross-sectional area of the channel, the cross-sectional area of the channel being smaller than that of the source and the drain, wherein the source, the drain, and the channel form a dumbbell shape, such that each of the source and the drain form an end of the dumbbell shape, and the channel forms a middle portion of the dumbbell shape and does not touch the substrate;
    forming a first junction positioned between the source and the channel, wherein the cross-sectional diameter of the first junction continuously varies in an increasing manner from the cross-sectional diameter of the channel to the cross-sectional diameter of the source to connect the source to the channel without a stepwise transition between the cross-sectional diameter of the channel and the cross-sectional diameter of the source; and
    forming a second junction positioned between the drain and the channel, wherein the cross-sectional diameter of the second junction continuously varies in an increasing manner from the cross-sectional diameter of the channel to the cross-sectional diameter of the drain to connect the drain to the channel without a stepwise transition between the cross-sectional diameter of the channel and the cross-sectional diameter of the drain; and
    wherein at least a portion of the source has a cross-sectional diameter that continuously varies in a vertical direction such that a portion of the source closest to the substrate is different than a portion of the source furthest from the substrate and in an increasing manner from the cross-sectional diameter of the first junction to the cross-sectional diameter of the portion of the source furthest from the first junction without a stepwise transition between the cross-sectional diameter of the channel and the cross-sectional diameter of the source; and
    wherein at least a portion of the drain has a cross-sectional diameter that continuously varies in a vertical direction such that a portion of the drain closest to the substrate is different than a portion of the drain furthest from the substrate and in an increasing manner from the cross-sectional diameter of the second junction to the cross-sectional diameter of the portion of the drain furthest from the first junction without a stepwise transition between the cross-sectional diameter of the channel and the cross-sectional diameter of the drain.

20. The method of claim 19, further comprising: forming a gate insulator adjacent to the channel; and forming a gate adjacent to the gate insulator.

* * * * *